(12) United States Patent
Morikazu et al.

(10) Patent No.: US 10,071,442 B2
(45) Date of Patent: Sep. 11, 2018

(54) LASER PROCESSING APPARATUS

(71) Applicant: DISCO CORPORATION, Tokyo (JP)

(72) Inventors: Hiroshi Morikazu, Tokyo (JP); Noboru Takeda, Tokyo (JP); Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 167 days.

(21) Appl. No.: 15/091,143

(22) Filed: Apr. 5, 2016

(65) Prior Publication Data
US 2017/0066078 A1    Mar. 9, 2017

(30) Foreign Application Priority Data
Sep. 9, 2015 (JP) .................... 2015-079711

(51) Int. Cl.
| | |
|---|---|
| *B23K 26/00* | (2014.01) |
| *H01L 21/268* | (2006.01) |
| *B23K 26/06* | (2014.01) |
| *B23K 26/0622* | (2014.01) |
| *H01L 21/67* | (2006.01) |
| *H01L 21/687* | (2006.01) |
| *B23K 103/00* | (2006.01) |

(52) U.S. Cl.
CPC ...... *B23K 26/0069* (2013.01); *B23K 26/0622* (2015.10); *B23K 26/0648* (2013.01); *H01L 21/268* (2013.01); *H01L 21/67115* (2013.01); *H01L 21/687* (2013.01); *B23K 2203/56* (2015.10)

(58) Field of Classification Search
CPC ........... B23K 26/0622; B23K 22/0069; B23K 26/0648; H01L 21/67115; H01L 21/687; H01L 21/268
USPC ............. 219/121.67, 121.69, 121.7, 121.73, 219/121.75; 428/43, 141, 312.6, 600
See application file for complete search history.

(56) References Cited

U.S. PATENT DOCUMENTS

| | | | |
|---|---|---|---|
| 2009/0203513 A1* | 8/2009 | Hashimoto | ............ B82Y 20/00 501/65 |
| 2009/0302428 A1* | 12/2009 | Sakamoto | .......... B23K 26/0057 257/620 |

FOREIGN PATENT DOCUMENTS

| | | | |
|---|---|---|---|
| JP | 10-305420 | | 11/1998 |
| JP | 2002-192370 | | 7/2002 |
| JP | 2012-24787 | * | 2/2012 |

* cited by examiner

*Primary Examiner* — Thien S Tran
(74) *Attorney, Agent, or Firm* — Greer Burns & Crain Ltd.

(57) ABSTRACT

A focusing unit of a laser processing apparatus includes: a focusing lens that focuses a laser beam oscillated from a laser beam oscillating unit; and a spherical aberration extending lens that extends the spherical aberration of the focusing lens. A pulsed laser beam is applied from the focusing unit to a workpiece held on a chuck table, to form shield tunnels each composed of a fine hole and an amorphous region shielding the fine hole, the shield tunnels extending from an upper surface toward a lower surface of the workpiece.

2 Claims, 6 Drawing Sheets

LASER PROCESSING APPARATUS

BACKGROUND OF THE INVENTION

Field of the Invention

The present invention relates to a laser processing apparatus for laser-processing a workpiece such as a wafer. More particularly, the invention relates to a laser processing apparatus suitable for laser processing of a single crystal substrate such as a sapphire ($Al_2O_3$) substrate, a silicon carbide (SiC) substrate, a gallium nitride (GaN) substrate, a lithium tantalate ($LiTaO_3$) substrate, a lithium niobate ($LiNbO_3$) substrate, a diamond substrate, and a quartz substrate.

Description of the Related Art

In an optical device manufacturing process, an optical device layer including an n-type nitride semiconductor layer and a p-type nitride semiconductor layer is stacked on a surface of a sapphire ($Al_2O_3$) substrate, a silicon carbide (SiC) substrate or a gallium nitride (GaN) substrate, and optical devices such as light-emitting diodes and laser diodes are formed in a plurality of regions partitioned by a plurality of crossing division lines, to configure an optical device wafer. Then, the optical device wafer is cut by applying a laser beam along the division lines so as to divide the regions formed with the optical devices, thereby manufacturing the individual optical devices. In addition, a SAW wafer wherein SAW devices are formed on a surface of a lithium tantalate ($LiTaO_3$) substrate, a lithium niobate ($LiNbO_3$) substrate, a silicon carbide (SiC) substrate, a diamond substrate or a quartz substrate is also cut by applying a laser beam along division lines, thereby producing the individual SAW devices.

As a method for dividing a wafer such as the aforementioned optical device wafer or SAW wafer, a laser processing method has been tried wherein a pulsed laser beam of such a wavelength as to be transmitted through the wafer as a workpiece is applied to the wafer while adjusting the focal point to a position inside a region to be divided. The dividing method using this laser processing method is a technology wherein a pulsed laser beam of such a wavelength as to be transmitted through the wafer is applied to the wafer from the side of a one-side surface of the wafer while adjusting the focal point to a position inside the wafer, to continuously form a modified layer, which will serve as a starting point of breakage, inside the wafer along each division line, and an external force is applied to the wafer along each division line where strength is lowered by the formation of the modified layer, thereby dividing the wafer along the division lines (see, for example, Japanese Patent No. 3408805).

In addition, as a method for dividing a wafer such as a semiconductor wafer or an optical device wafer along division lines, a technology has been put to practical use wherein a pulsed laser beam of such a wavelength as to be absorbed in the wafer as a workpiece is applied to the wafer along the division lines, thereby to perform ablation processing and form laser-processed grooves, and an external force is applied to the wafer along each division line where the laser-processed groove is formed as a starting point of breakage, thereby cutting up the wafer along the division lines (see, for example, Japanese Patent Laid-open No. Hei10-305420).

SUMMARY OF THE INVENTION

However, in the laser processing method in which the pulsed laser beam of such a wavelength as to be transmitted through the wafer as a workpiece is applied to the wafer while adjusting the focal point to a position inside the region to be divided, it is necessary, for dividing an optical device wafer composed of a sapphire ($Al_2O_3$) substrate or the like into the individual devices along the division lines, to apply the laser beam to the same division line a number of times, which leads to a poor productivity.

Besides, in the laser processing method in which the pulsed laser beam of such a wavelength as to be absorbed in the wafer as a workpiece is applied to the wafer along each division line to perform ablation processing and form a laser-processed groove along each division line, the application of the laser beam causes scattering of debris, and the scattered debris would be deposited on the surfaces of the devices, thereby lowering the device quality.

Accordingly, it is an object of the present invention to provide a laser processing apparatus by which suitable laser processing can be efficiently conducted along division lines set on a workpiece.

In accordance with an aspect of the present invention, there is provided a laser processing apparatus including: a chuck table that holds a workpiece; laser beam applying means that applies a pulsed laser beam to the workpiece held on the chuck table; and processing feeding means that moves the chuck table and the laser beam applying means relative to each other in a processing feed direction, wherein the laser beam applying means includes laser beam oscillating means that oscillates a laser beam of such a wavelength as to be transmitted through the workpiece, and a focusing unit that focuses the laser beam oscillated from the laser beam oscillating means to apply the laser beam to the workpiece held on the chuck table, the focusing unit includes a focusing lens that focuses the laser beam oscillated from the laser beam oscillating means, and a spherical aberration extending lens that extends spherical aberration of the focusing lens, and the pulsed laser beam is applied from the focusing unit to the workpiece held on the chuck table to form shield tunnels each composed of a fine hole and an amorphous region shielding the fine hole, the shield tunnels extending from an upper surface toward a lower surface of the workpiece.

Preferably, the spherical aberration extending lens extends the spherical aberration of the focusing lens to 100 to 500 μm. Preferably, the pulsed laser beam has a peak energy density set to within the range of from 1 to 100 $TW/cm^2$.

According to the laser processing apparatus of the present invention, the focusing unit includes the focusing lens that focuses the laser beam oscillated from the laser beam oscillating means, and the spherical aberration extending lens that extends the spherical aberration of the focusing lens. When the pulsed laser beam is applied from the focusing unit to the workpiece held on the chuck table, the spherical aberration is extended by the spherical aberration extending lens, and the shield tunnels each composed of a fine hole and an amorphous region shielding the fine hole are formed to extend from an upper surface toward a lower surface of the workpiece. Accordingly, the shield tunnels ranging substantially from the upper surface to the lower surface of the workpiece can be efficiently formed along the division lines.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
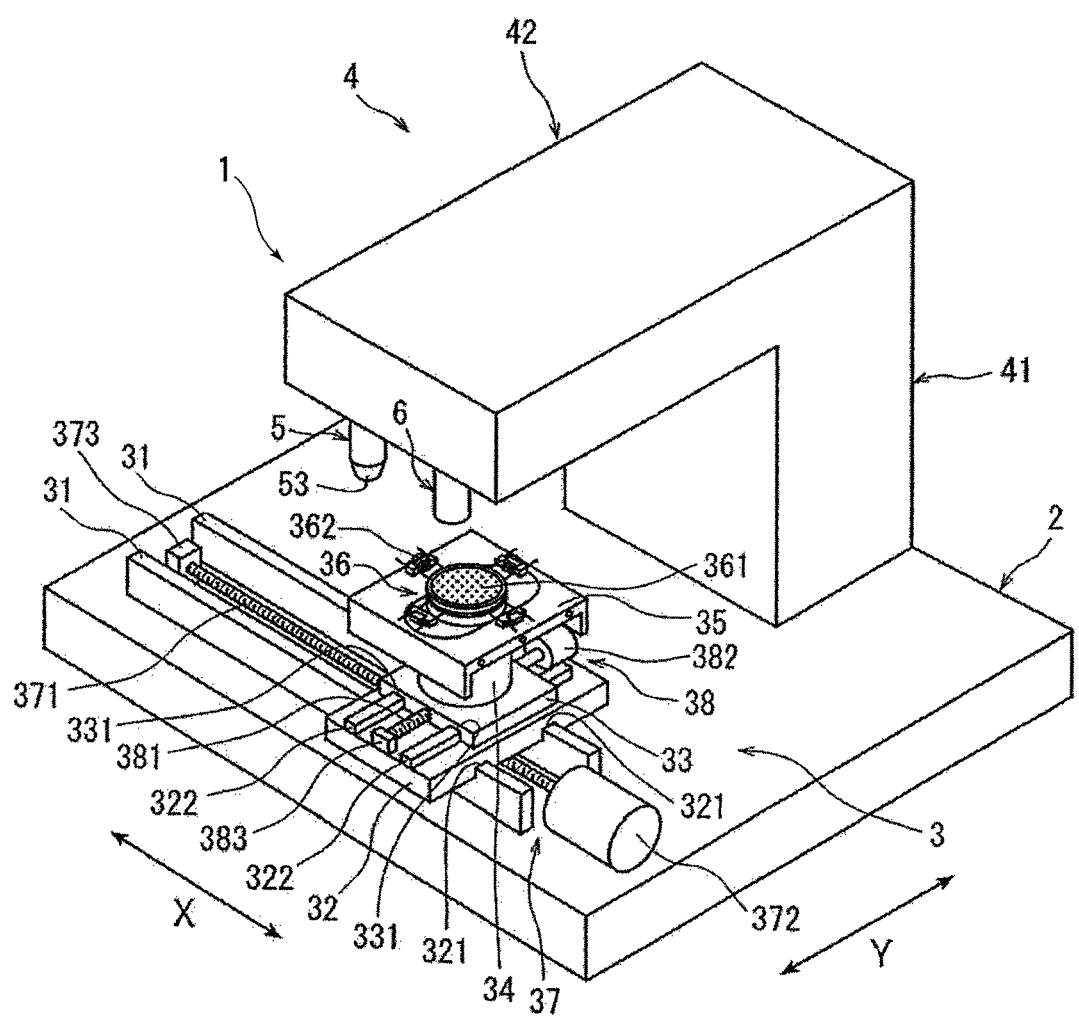
FIG. 1 is a perspective view of a laser processing apparatus configured according to the present invention.

A preferred embodiment of the laser processing apparatus configured according to the present invention will be described in detail below, referring to the attached drawings. FIG. 1 shows a perspective view of a laser processing apparatus 1 configured according to the present invention. The laser processing apparatus 1 includes a stationary base 2, a chuck table mechanism 3 that is disposed on the stationary base 2 in such a manner as to be movable in an X-axis direction, namely, a processing feed direction indicated by arrow X and holds a workpiece thereon, and a laser beam applying unit 4 disposed on the stationary base 2.

The chuck table mechanism 3 includes: a pair of guide rails 31 disposed on the stationary base 2 in parallel along the X-axis direction; a first slide block 32 disposed on the guide rails 31 in such a manner as to be movable in the X-axis direction; a second slide block 33 disposed on the first slide block 32 in such a manner as to be movable in a Y-axis direction, namely, an indexing feed direction indicated by arrow Y that is orthogonal to the X-axis direction; a cover table 35 supported on the second slide block 33 by a cylindrical member 34; and a chuck table 36 as workpiece holding means. The chuck table 36 includes a suction holding chuck 361 formed from a porous material, and, for example, a circular disk-shaped semiconductor wafer as a workpiece is held on an holding surface consisting of an upper surface of the suction holding chuck 361 by suction means (not shown). Thus chuck table 36 configured in this manner is rotated by a pulse motor (not shown) disposed inside the cylindrical member 34. Note that the chuck table 36 is equipped with clamps 362 for fixing an annular frame that supports the workpiece such as a semiconductor wafer through a protective tape.

The first slide block 32 is provided in its lower surface with a pair of guided grooves 321 to be fitted to the pair of guide rails 31 and is provided on its upper surface with a pair of guide rails 322 formed in parallel along the Y-axis direction. The first slide block 32 thus configured can be moved in the X-axis direction along the pair of guide rails 31, through engagement of the guided grooves 321 with the pair of guide rails 31. The chuck table mechanism 3 in this embodiment includes processing feeding means 37 for moving the first slide block 32 in the X-axis direction along the pair of guide rails 31. The processing feeding means 37 includes a male screw rod 371 disposed in parallel to and between the pair of guide rails 31, and a drive source such as a pulse motor 372 for rotationally driving the male screw rod 371. Of the male screw rod 371, one end is rotatably supported on a bearing block 373 fixed on the stationary base 2, and the other end is in drive connection with an output shaft of the pulse motor 372. Note that the male screw rod 371 is in screw engagement with a female screw through-hole formed in a female screw block (not shown) provided in a projecting manner at a lower surface of a central portion of the first slide block 32. Therefore, with the male screw rod 371 driven by the pulse motor 372 to rotate normally and reversely, the first slide block 32 is moved in the X-axis direction along the guide rails 31.

The second slide block 33 is provided in its lower surface with a pair of guided grooves 331 to be fitted to the pair of guide rails 322 provided on the upper surface of the first slide block 32, and can be moved in the Y-axis direction, through engagement of the guided grooves 331 with the pair of guide rails 322. The chuck table mechanism 3 in this embodiment includes indexing feeding means 38 for moving the second slide block 33 in the Y-axis direction along the pair of guide rails 322 provided on the first slide block 32. The indexing feeding means 38 includes a male screw rod 381 disposed in parallel to and between the pair of guide rails 322, and a drive source such as a pulse motor 382 for rotationally driving the male screw rod 381. Of the male screw rod 381, one end is rotatably supported on a bearing block 383 fixed on the upper surface of the first slide block 32, and the other end is in drive connection with an output shaft of the pulse motor 382. Note that the male screw rod 381 is in screw engagement with a female screw through-hole formed in a female screw block (not shown) provided in a projecting manner at a lower surface of a central portion of the second slide block 33. Therefore, with the male screw rod 381 driven by the pulse motor 382 to rotate normally and reversely, the second slide block 33 is moved in the Y-axis direction along the guide rails 322.

The laser beam applying unit 4 includes: a support member 41 disposed on the stationary base 2; a casing 42 supported by the support member 41 and extending substantially horizontally; laser beam applying means 5 disposed on the casing 42; and imaging means 6 disposed at a front end portion of the casing 42 and detecting a processing region in which laser processing is to be performed. Note that the imaging means 6 includes illuminating means for illuminating a workpiece, an optical system for capturing a region illuminated by the illuminating means, an imaging element (CCD) for picking up an image captured by the optical system, and the like, and transmits an image signal obtained by the imaging to control means (not shown).

The laser beam applying means 5 will be described referring to FIG. 2. The laser beam applying means 5 includes: pulsed laser beam oscillating means 51; output adjusting means 52 for adjusting the output of a pulsed laser beam oscillated by the pulsed laser beam oscillating means 51; and a focusing unit (Condenser) 53 for focusing the pulsed laser beam oscillated from the laser beam oscillating means 51 and adjusted in output by the output adjusting means 52, to thereby apply the pulsed laser beam to the workpiece held on the chuck table 36. The pulsed laser beam oscillating means 51 includes a pulsed laser oscillator 511, and repetition frequency setting means 512 added to the pulsed laser oscillator 511. Note that the pulsed laser oscillator 511 of the pulsed laser beam oscillating means 51, in this embodiment, oscillates a pulsed laser beam LB having a wavelength of 1,030 nm. Note that the pulsed laser beam oscillating means 51 and the output adjusting means 52 are controlled by the control means (not shown).

The focusing unit 53 includes: a direction conversion mirror 531 for converting the direction of the pulsed laser beam LB oscillated from the pulsed laser beam oscillating means 51 and adjusted to the predetermined output by the output adjusting means 52 toward the lower side; a focusing lens 532 for focusing the pulsed laser beam LB the direction of which has been converted by the direction conversion mirror 531; and a spherical aberration extending lens 533 for extending the spherical aberration of the focusing lens 532. It has been confirmed by the present inventor that a shield tunnel is formed in the case where a value obtained by dividing the numerical aperture (NA) of the focusing lens 532 of the focusing unit 53 by the refractive index (N) of the workpiece composed of a single crystal substrate is within the range of from 0.05 to 0.4.

Figure 2:
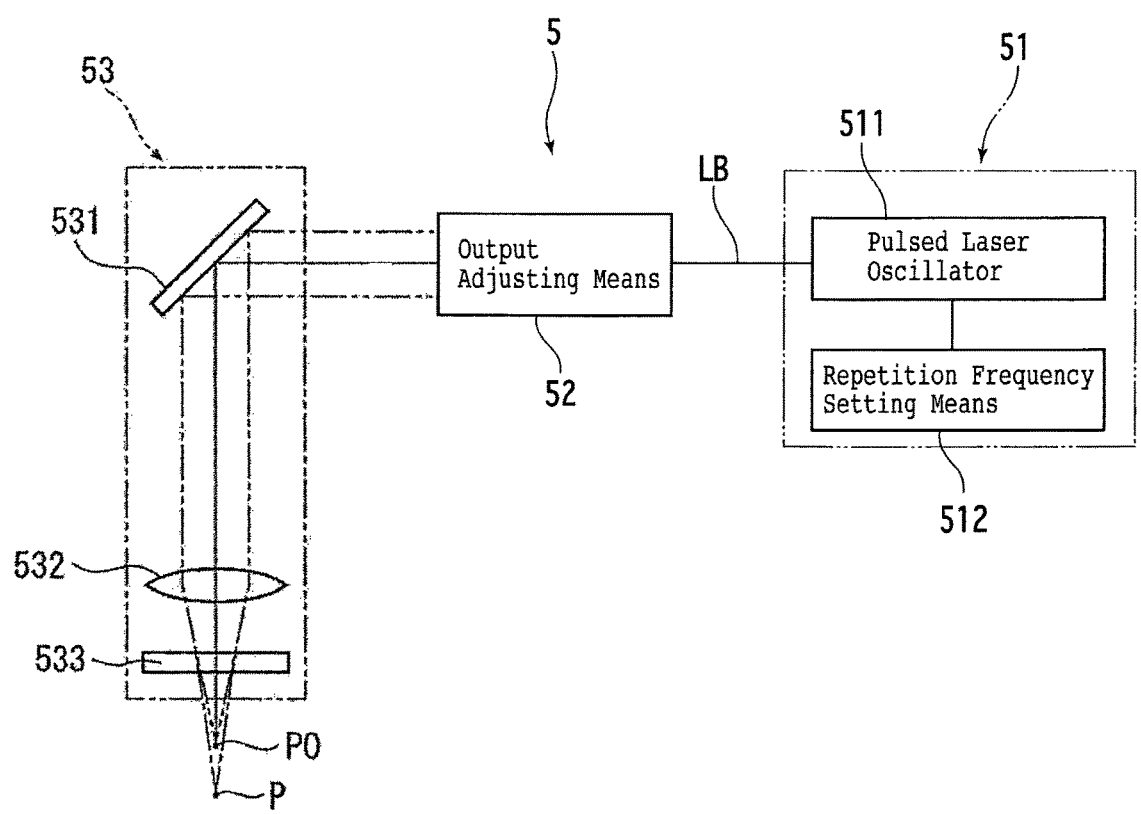
FIG. 2 is a block diagram of laser beam applying means possessed by the laser processing apparatus shown in FIG. 1.

As illustrated in FIG. 2, the spherical aberration extending lens 533 extends a focal point P0 of the focusing lens 532 itself to an aberration focal point P. Note that it is desirable for the spherical aberration extending lens 533 to be set in such a manner as to extend the spherical aberration of the focusing lens 532 to a value in the range of from 100 to 500 μm.

Figure 3A:
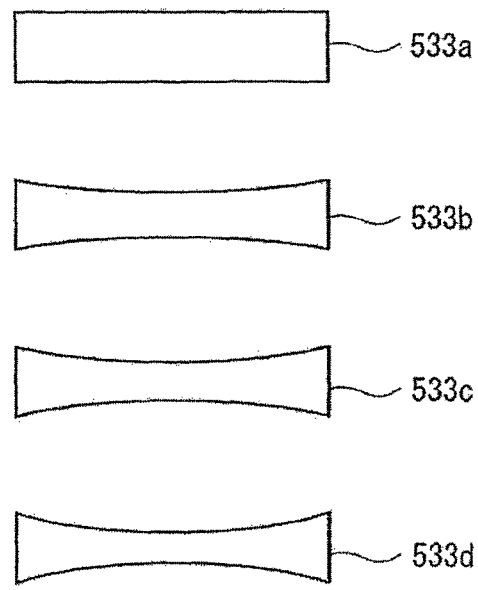
FIG. 3A is a view for explaining four spherical aberration extending lenses.
Figure 3B:
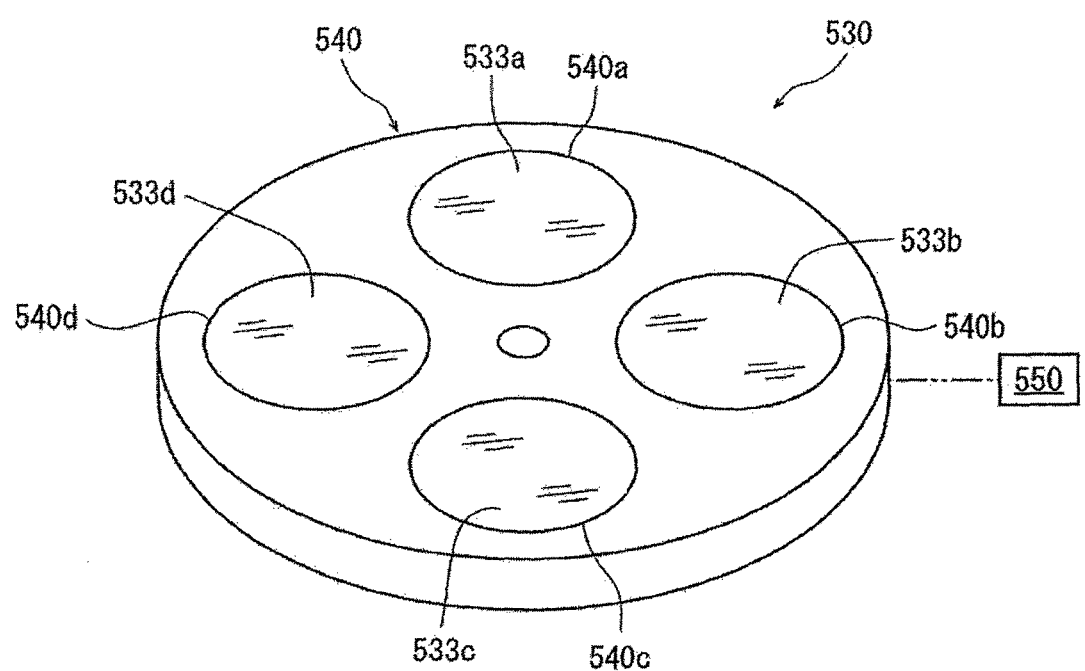
FIG. 3B is a perspective view of a spherical aberration changing mechanism wherein the four spherical aberration extending lenses are arranged on a rotatable disk.

FIG. 3A illustrates a plurality of (in this embodiment, four) spherical aberration extending lenses 533a, 533b, 533c and 533d. FIG. 3B depicts a spherical aberration changing mechanism 530 in which the four spherical aberration extending lenses 533a, 533b, 533c and 533d are disposed on a rotatable disk. The four spherical aberration extending lenses 533a, 533b, 533c and 533d are each formed from quartz. The spherical aberration extending lens 533a is composed of a quartz plate lens having an upper surface and a lower surface parallel to each other, whereas the spherical aberration extending lenses 533b, 533c and 533d are composed of concave lenses which are different in spreading angle. Note that in this embodiment the spherical aberration extending lens 533b is set to have the smallest spreading angle, the spherical aberration extending lens 533c is set to have an intermediate spreading angle, and the spherical aberration extending lens 533d is set to have the largest spreading angle. Therefore, among the four spherical aberration extending lenses 533a, 533b, 533c and 533d, the aberration is set to increase in the order of the spherical aberration extending lenses 533a, 533b, 533c and 533d.

As illustrated in FIG. 3B, the four spherical aberration extending lenses 533a, 533b, 533c and 533d constituting the spherical aberration changing mechanism 530 configured as above are disposed respectively in through-holes 540a, 540b, 540c and 540d provided in a rotatable disk 540. The rotatable disk 540 thus fitted with the spherical aberration extending lenses 533a, 533b, 533c and 533d is rotated about an axis by a rotating mechanism 550. The rotating mechanism 550 for rotationally driving the rotatable disk 540 is controlled by the control means (not shown). By providing the spherical aberration changing mechanism 530 in which the plurality of spherical aberration extending lenses 533a, 533b, 533c and 533d are disposed on the rotatable disk 540, a spherical aberration extending lens suited to the length of the shield tunnel to be formed can be selected.

Figure 4:
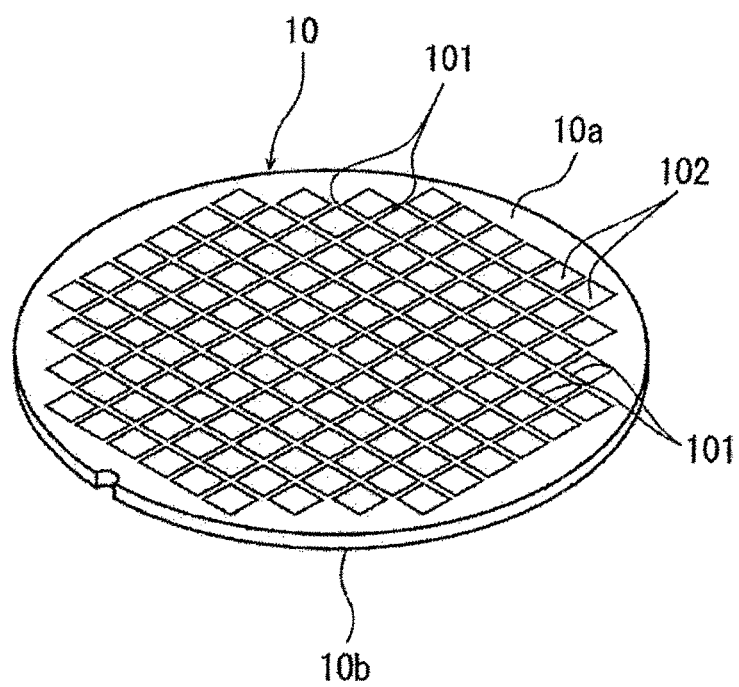
FIG. 4 is a perspective view of an optical device wafer as a workpiece.

The laser processing apparatus 1 in this embodiment is configured as above, and its operation will be described below. FIG. 4 shows a perspective view of an optical device wafer 10. The optical device wafer 10 shown in FIG. 4 is composed of a sapphire ($Al_2O_3$) substrate which is a single crystal substrate having a thickness of 400 μm, on a front surface 10a of which an optical device layer composed of an n-type gallium nitride semiconductor layer and a p-type gallium nitride semiconductor layer is formed, and optical devices 102 are formed in a plurality of regions partitioned by a plurality of crossing division lines 101. Now, a description will be made of a method by which shield tunnels each composed of a fine hole and an amorphous region shielding the fine hole are formed in the optical device wafer 10 along the division lines 101 in such a manner as to extend from an upper surface toward a lower surface of the optical device wafer 10.

Figure 5:
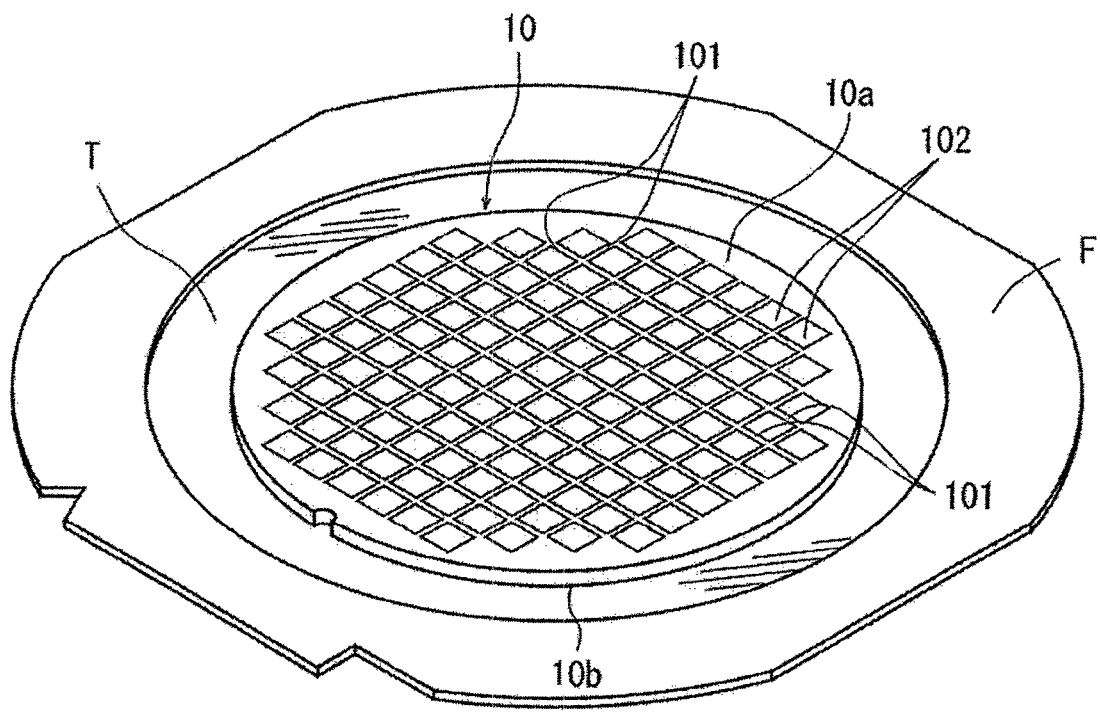
FIG. 5 is a perspective view showing a state wherein the optical device wafer shown in FIG. 4 is adhered to a dicing tape attached to an annular frame.

First, a workpiece supporting step is conducted in which a surface of a dicing tape T formed from a synthetic resin is adhered to a back surface 10b of the optical device wafer 10 and an outer peripheral portion of the dicing tape is supported by an annular frame F. Specifically, as shown in FIG. 5, the outer peripheral portion of the dicing tape T is so disposed as to cover an inside opening portion of the annular frame F, and the back surface 10b of the optical device wafer 10 is adhered to the surface of the dicing tape T. Note that the dicing tape T in this embodiment is formed from a polyvinyl chloride (PVC) sheet.

After the aforementioned workpiece supporting step is conducted, the optical device wafer 10 is placed on the chuck table 36 of the laser processing apparatus 1 shown in FIG. 1, with the dicing tape T side on the lower side. Then, the suction means (not shown) is operated, whereby the optical device wafer 10 is suction held onto the chuck table 36 through the dicing tape T (workpiece holding step). Accordingly, the optical device wafer 10 held on the chuck table 36 through the dicing tape T has its front surface 10a on the upper side. Note that the annular frame F supporting the optical device wafer 10 through the dicing tape T is fixed by the clamps 362 equipped at the chuck table 36.

After the aforementioned workpiece holding step is performed, the chuck table 36 with the optical device wafer 10 suction held thereon is positioned into a position immediately below the imaging means 6 by operating the processing feeding means 37. After the chuck table 36 is positioned in a position immediately below the imaging means 6, an alignment work is performed in which a processing region of the optical device wafer 10 to be laser processed is detected by the imaging means 6 and the control means (not shown). Specifically, the imaging means 6 and the control means (not shown) perform an image processing such as pattern matching for making the alignment between the division lines 101 extending in a first direction of the optical device wafer 10 and the focusing unit 53 of the laser beam applying means 5 for applying the laser beam to the optical device wafer 10 along the division lines 101, whereby alignment of a laser beam applying position is carried out. In addition, the alignment of the laser beam applying position is similarly carried out also with respect to the division lines 101 formed on the optical device wafer 10 in a direction orthogonal to the first direction (alignment step).

Figure 6A:
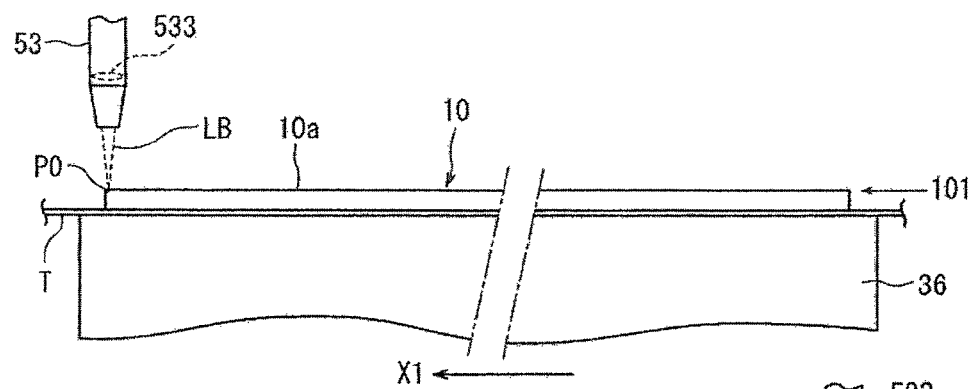
FIGS. 6A to 6E are views for explaining a shield tunnel forming step applied to the optical device wafer shown in FIG. 4 by use of the laser processing apparatus shown in FIG. 1.

After the aforementioned alignment step is conducted, the chuck table 36 is moved to the laser beam applying region where the focusing unit 53 of the laser beam applying means 5 for applying the laser beam is positioned, and the predetermined division line 101 is positioned at a position just under the focusing unit 53, as illustrated in FIG. 6A. In this instance, as depicted in FIG. 6A, the optical device wafer 10 is positioned in such a manner that one end (the left end in FIG. 6A) of the division line 101 is positioned just under the focusing unit 53. Then, the focusing unit 53 is moved in an optical axis direction by operating focal point adjusting means (not shown) in such a manner that the focal point P0 of the pulsed laser beam LB, which is focused by the focusing lens 532 of the focusing unit 53 and of which the spherical aberration is extended by the spherical aberration extending lens 533, is positioned into a desired position in the thickness direction from the front surface 10a of the optical device wafer 10 composed of the sapphire ($Al_2O_3$) substrate as the single crystal substrate (positioning step). Note that in this embodiment the focal point P0 of the pulsed laser beam LB is positioned into a desired position in the optical device wafer 10 from the front surface 10a of the optical device wafer 10 composed of the sapphire ($Al_2O_3$) substrate as the single crystal substrate on which the pulsed laser beam LB is incident (for example, a position deviated from the front surface 10a toward the back surface 10b side by 5 to 10 μm). Accordingly, the aberration focal point P is positioned at a position which is further on the back surface 10b side.

Figure 6B:
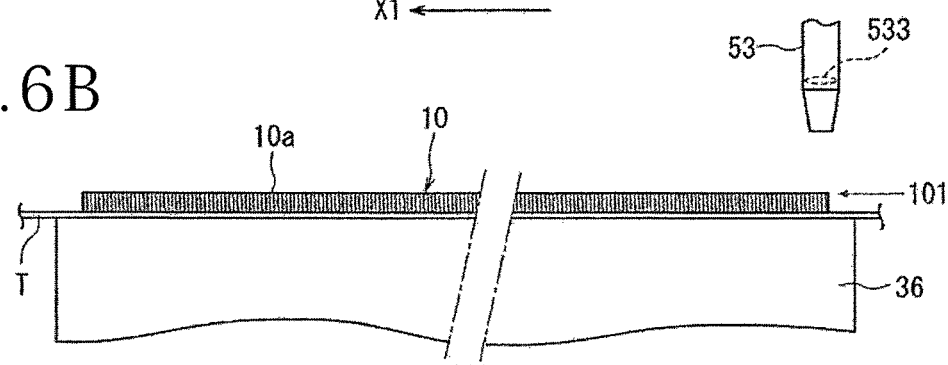

After the aforementioned positioning step is performed, a shield tunnel forming step is carried out wherein the laser beam applying means 5 is operated to apply the pulsed laser beam LB from the focusing unit 53 in such a manner that a fine hole and an amorphous region shielding the fine hole are formed from around the focal point P0 (the front surface 10a), positioned in the optical device wafer 10 composed of the sapphire ($Al_2O_3$) substrate as the single crystal substrate, toward the back surface 10b of the optical device wafer 10, thereby forming a shield tunnel. Specifically, while the pulsed laser beam LB having such a wavelength as to be transmitted through the sapphire ($Al_2O_3$) substrate as the single crystal substrate constituting the optical device wafer 10 is being applied from the focusing unit 53, the chuck table 36 is moved at a predetermined feed velocity in the direction indicated by arrow X1 in FIG. 6A (shield tunnel forming step). Then, when the other end (the right end in FIG. 6B) of the division line 101 has reached the laser beam applying position of the focusing unit 53 of the laser beam applying means 5 as shown in FIG. 6B, the application of the pulsed laser beam LB is stopped and the movement of the chuck table 36 is stopped.

Figure 6C:
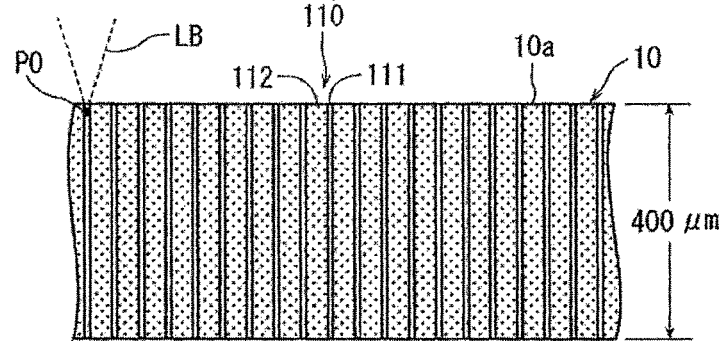
Figure 6D:
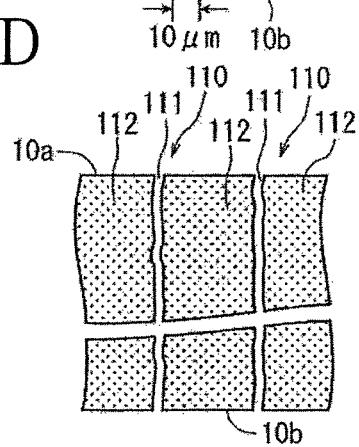
Figure 6E:
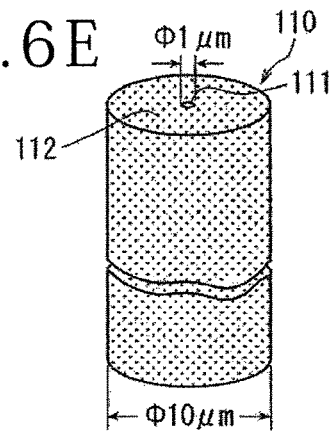

With the aforementioned shield tunnel forming step carried out, fine holes 111 and amorphous regions 112 formed surrounding the fine holes 111 are grown inside the optical device wafer 10 composed of the sapphire ($Al_2O_3$) substrate as the single crystal substrate in such a manner as to extend from around the aberration focal point P of the pulsed laser beam LB (the front surface 10a) toward the back surface 10b, as shown in FIG. 6C, whereby amorphous shield tunnels 110 are formed at a predetermined interval (in this embodiment at an interval of 10 μm=(processing feed rate: 1,000 mm/second)/(repetition frequency: 100 kHz)) along the division line 101. As depicted in FIGS. 6D and 6E, the shield tunnels 110 thus formed are each constituted of the fine hole 111 of a diameter of about 1 μm formed in the center and the amorphous region 112 of a diameter of 10 μm formed surrounding the fine hole 111; in this embodiment, the amorphous regions 112 adjacent to each other are formed to be continuous with each other. Note that since the amorphous shield tunnels 110 formed in the aforementioned shield tunnel forming step can be formed to range from the front surface 10a to the back surface 10b of the optical device wafer 10 composed of the sapphire ($Al_2O_3$) substrate as the single crystal substrate, it is sufficient to apply the pulsed laser beam LB only one time even if the optical device wafer 10 composed of the sapphire ($Al_2O_3$) substrate as the single crystal substrate is large in thickness, and, accordingly, an extremely high productivity is ensured.

After the shield tunnel forming step is conducted along the predetermined division line 101 as aforementioned, the indexing feeding means 38 is operated to indexing-feed the chuck table 36 in the Y-axis direction by the interval of the division lines 101 formed on the optical device wafer 10 (indexing step), and the shield tunnel forming step is carried out. After the shield tunnel forming step is performed in this manner along all the division lines 101 formed in the first direction, the chuck table 36 is rotated by 90 degrees, and the shield tunnel forming step is conducted along the division lines 101 extending in the direction orthogonal to the division lines 101 formed in the first direction.

In order to form good shield tunnels 110 in the aforementioned shield tunnel forming step, it is desirable to set peak energy density of the pulsed laser beam LB to within the range of from 1 to 100 TW/cm². Note that the peak energy density can be obtained by:

Average output (W)/{Repetition frequency (Hz)× Spot area (cm²)×Pulse width (s)}.

Now, the ground for setting the peak energy density of the pulsed laser beam LB to within the range of from 1 to 100 TW/cm² will be described below.

Experiment 1

Condition 1 . . . Single crystal substrate: Sapphire substrate (400 μm thick)
Condition 2 . . . Wavelength of pulsed laser beam set to 1,030 nm
Condition 3 . . . Repetition frequency of pulsed laser beam set to 100 kHz
Condition 4 . . . Spot diameter of pulsed laser beam set to 10 μm
Condition 5 . . . Average output of pulsed laser beam set to 5 W
Condition 6 . . . Variable: Pulse width of pulsed laser beam Under the above conditions, the pulsed laser beam was applied to the sapphire substrate while varying the pulse width in the range of from 0.1 to 100 ps, and the processed state was observed.

When the pulse width was in the range of from 0.1 to 0.6 ps, a void was formed inside the sapphire substrate.

When the pulse width was in the range of from 0.7 to 63 ps, shield tunnels each composed of a fine hole and an amorphous region shielding the fine hole were formed inside the sapphire substrate.

When the pulse width was in the range of from 64 to 100 ps, the inside of the sapphire substrate melted.

From the above experimental results, it has been found that shield tunnels each composed of a fine hole and an amorphous region shielding the fine hole are formed inside the sapphire substrate when the pulse width is in the range of from 0.7 to 63 ps. Therefore, when the peak energy density is determined by assuming the pulse width to be 0.7 to 63 ps under the above-mentioned conditions, it is seen that the shield tunnels are formed by setting the peak energy density to within the range of from 1 to 100 TW/cm².

Experiment 2

Condition 1 . . . Single crystal substrate: Sapphire substrate (400 μm thick)
Condition 2 . . . Wavelength of pulsed laser beam set to 1,030 nm Condition 3 . . . Average output of pulsed laser beam set to 5 W
Condition 4 . . . Pulse width set to 10 ps
Condition 5 . . . Spot diameter of pulsed laser beam set to 10 μm
Condition 6 . . . Variable: Repetition frequency of pulsed laser beam The pulsed laser beam was applied to the sapphire substrate while varying the repetition frequency in the range of from 1 to 1,000 kHz under the above-mentioned conditions, and the processed state was observed.

When the repetition frequency was in the range of from 1 to 6 kHz, the inside of the sapphire substrate was broken and cracks were formed in a radial pattern.

When the repetition frequency was in the range of from 7 to 640 kHz, shield tunnels each composed of a fine hole and an amorphous region shielding the fine hole were formed inside the sapphire substrate.

When the repetition frequency was in the range of from 650 to 1,000 kHz, a void was formed inside the sapphire substrate and the shield tunnels were not formed.

From the above experimental results, it has been found that the shield tunnels each composed of a fine hole and an amorphous region shielding the fine hole are formed inside the sapphire substrate when the repetition frequency is in the range of from 7 to 640 kHz. Therefore, when the peak energy density is determined while assuming the repetition frequency to be 7 to 640 kHz under the above-mentioned conditions, it is seen that the shield tunnels are formed by setting the peak energy density to within the range of from 1 to 100 TW/cm².

While Experiments 1 and 2 above show an example carried out on the sapphire (Al₂O₃) substrate, substantially the same results were obtained also when experiments equivalent to Experiments 1 and 2 were carried out on a silicon carbide (SiC) substrate, a gallium nitride (GaN) substrate, a lithium tantalate (LiTaO₃) substrate, a lithium niobate (LiNbO₃) substrate, a diamond substrate, and a quartz (SiO₂) substrate as the single crystal substrate.

Experiment 3

Condition 1 . . . Single crystal substrate: Sapphire substrate (1,000 μm thick)
Condition 2 . . . Wavelength of pulsed laser beam set to 1,030 nm
Condition 3 . . . Pulse width set to 10 ps
Condition 4 . . . Spot diameter of pulsed laser beam set to 10 μm
Condition 5 . . . Average output of pulsed laser beam set to 5 W
Condition 6 . . . Variable: Spherical aberration of focusing lens Shield tunnels were formed while varying the spherical aberration of the focusing lens 532 by the spherical aberration extending lens 533 under the above-mentioned conditions, and the length of the shield tunnels and the acceptability of the shield tunnels were observed.

The experimental (observed) results are as follows.

| Spherical aberration (μm) | Length of shield tunnels (μm) | Acceptability of shield tunnels |
|---|---|---|
| 0 | 70 | good |
| 50 | 70 | good |
| 100 | 150 | good |
| 150 | 220 | good |
| 200 | 300 | good |
| 250 | 360 | good |
| 300 | 410 | good |
| 350 | 470 | good |
| 400 | 530 | good |
| 450 | 600 | good |
| 500 | 620 | good |
| 550 | 570 | rather good |
| 600 | 300 | rather good |
| 650 | 200 | rather good |
| 700 | 70 | bad |
| 750 | 0 | |
| 800 | 0 | |

From the above experimental results, it has been found that good shield tunnels of a length of 150 to 620 μm were formed when the spherical aberration of the focusing lens 532 is in the range of from 100 to 500 μm. Therefore, it is desirable for the spherical aberration extending lens 533 to be set in such a manner as to extend the spherical aberration of the focusing lens 532 to 100 to 500 μm.

While the present invention has been described based on the illustrated embodiment, the invention is not to be limited to the embodiment, and various modifications are possible within the scope of the gist of the invention. For example, while the laser beam has been applied from the front surface side of the wafer in the aforementioned embodiment, the laser beam may be applied from the back surface side of the wafer.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
a chuck table that holds a workpiece;
laser beam applying means that applies a pulsed laser beam to the workpiece held on the chuck table; and
processing feeding means that moves the chuck table and the laser beam applying means relative to each other in a processing feed direction,
wherein the laser beam applying means includes laser beam oscillating means that oscillates a laser beam of such a wavelength as to be transmitted through the workpiece, and a focusing unit that focuses the laser beam oscillated from the laser beam oscillating means to apply the laser beam to the workpiece held on the chuck table,
the focusing unit includes a focusing lens that focuses the laser beam oscillated from the laser beam oscillating means, and a spherical aberration extending lens that selectively extends spherical aberration of the focusing lens, and
the pulsed laser beam is applied from the focusing unit to the workpiece held on the chuck table to form shield tunnels each composed of a fine hole and an amorphous region shielding the fine hole, the shield tunnels extending from an upper surface toward a lower surface of the workpiece,
wherein the spherical aberration extending lens extends the spherical aberration of the focusing lens in a range of from 100 to 500 μm.

2. The laser processing apparatus according to claim 1, wherein the pulsed laser beam has a peak energy density set to within a range of from 1 to 100 TW/cm$^2$.

\* \* \* \* \*